United States Patent
Oshima et al.

(10) Patent No.: US 6,927,628 B2
(45) Date of Patent: Aug. 9, 2005

(54) GAIN-CONTROL METHOD AND DEVICE FOR CASCADED AMPLIFIERS

(75) Inventors: Takashi Oshima, Saitama (JP); Kenji Maio, Tokyo (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/412,424

(22) Filed: Apr. 14, 2003

(65) Prior Publication Data

US 2003/0218501 A1 Nov. 27, 2003

(30) Foreign Application Priority Data

May 24, 2002 (JP) ..................................... P2002-150944

(51) Int. Cl.[7] .............................................. H03G 5/16
(52) U.S. Cl. ..................... 330/133; 330/150; 330/310; 330/279
(58) Field of Search ......................... 330/98, 133, 134, 330/136, 150, 279, 310, 311

(56) References Cited

U.S. PATENT DOCUMENTS

| | | | | |
|---|---|---|---|---|
| 4,456,889 A | * | 6/1984 | Kumar | ........................ 330/279 |
| 5,475,342 A | * | 12/1995 | Nakamura et al. | .......... 330/136 |
| 6,498,927 B2 | * | 12/2002 | Kang et al. | .................. 330/133 |

FOREIGN PATENT DOCUMENTS

| | | |
|---|---|---|
| EP | 0 777 324 A2 | 11/1996 |
| EP | 0 777 324 A3 | 11/1996 |
| JP | 9-191221 | 11/1996 |

OTHER PUBLICATIONS

Masaru Kokubo, Masaaki Shida, Takashi Ishikawa, Hiroki Sonoda, Katsumi Yamamoto, Tatsuji Matsuura, Masaharu Matsuoka, Takefumi Endo, Takao Kobayashi, Katsumi Oosaki, Takaaki Henmi, Junya Kudoh and Hirokazu Miyagawa, "A 2.4 GHz RF Transceiver with Digital Channel–Selection Filter for Bluetooth", (IEEE) ISSCC 2002 Visuals Supplement, Session 5—Wireless Networking Transceivers, pp. 72–73.

Norm Filiol, Neil Birkett, James Cherry, Florinel Balteanu, Christian Cojocaru, Ardeshir Namdar, Tolga Pamir, Kashif Sheikh, Gilles Glandon, Daniel Payer, Ashok Swaminathan, Robert Forbes, Thomas Riley, S.M. Alinoor, Edward Macrobbie, Mark Cloutier, Spyros Pipilos, Theo Varelas, "A 22mW Bluetooth RF Transceiver with Direct RF Modulation and On–chip IF Filtering", 2001 IEEE International Solid–State Circuits Conference, ISSCC 2001, Session 13—Wireless LAN, pp. 202–203.

* cited by examiner

*Primary Examiner*—Khanh V. Nguyen
(74) *Attorney, Agent, or Firm*—Reed Smith LLP; Stanley P. Fisher, Esq.; Juan Carlos A. Marquez, Esq.

(57) ABSTRACT

A gain-control method and device that enable high-speed gain switching of cascaded programmable gain amplifiers (PGA) without a high-resolution A/D converter is provided. In one example, the gain-control method for cascaded PGAs detects all the input levels of the PGAs, calculates the optimum gains of the PGAs each on the basis of the detection results, and sets the obtained optimum gains of each of the PGAs at one time, whereby high-speed gain switching becomes possible. The gain-control device for cascaded PGAs that implements this gain-control method includes peak hold circuits that retain the input levels of each of the PGAs, a switch group that sequentially switches outputs of the peak hold circuits, an A/D converter that sequentially detects the outputs from the switch group, and a control and operation device that calculates the optimum gains of the PGAs from the detection results by the A/D converter to set the calculated optimum gains simultaneously to each of the PGAs.

12 Claims, 9 Drawing Sheets

F I G. 9
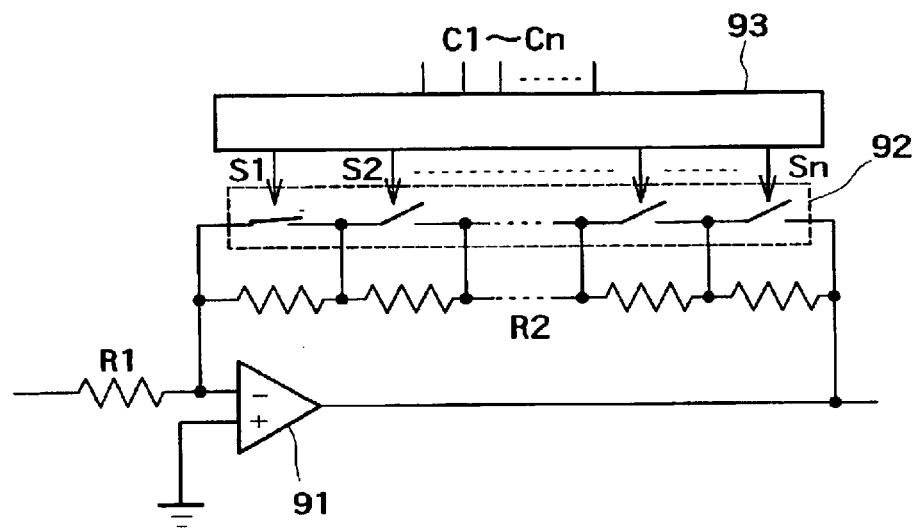
F I G. 10
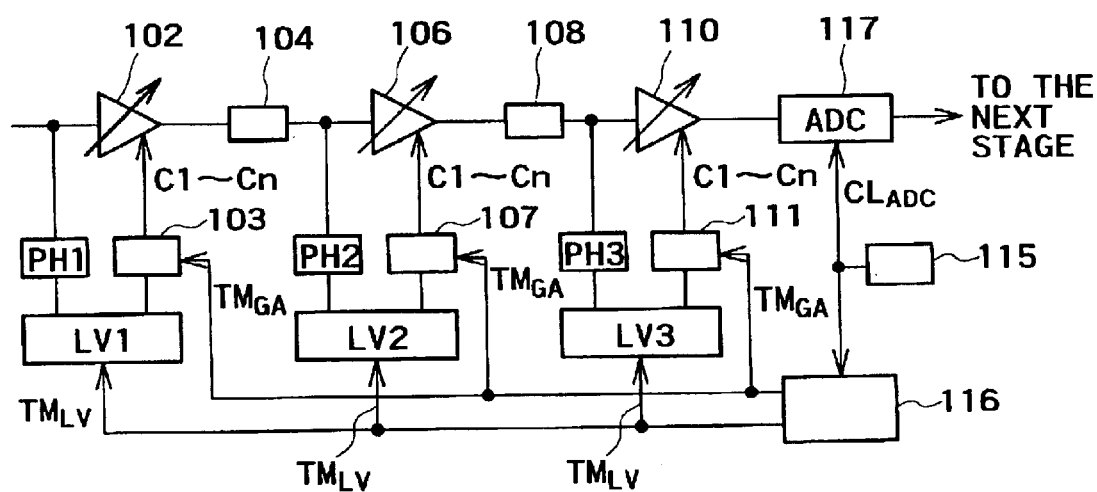

GAIN-CONTROL METHOD AND DEVICE FOR CASCADED AMPLIFIERS

BACKGROUND OF THE INVENTION

1. Field of the Invention

The present invention generally relates to a gain-control method and device for cascaded programmable gain amplifiers and, more specifically, to a gain-control method and device suitable for controlling at a high speed the gain of cascaded programmable gain amplifiers in an integrated circuit (IC) for radio receivers.

2. Discussion of Background

In a radio receiver, the signal level inputted from the antenna covers a very wide range, which is converted into a suitable level by cascaded programmable gain amplifiers (PGAs) and is finally controlled so as to swing to the maximum within the input dynamic range of the ADC.

The PGAs are located on the pre-stages of band pass filters (BPFs) because the BPFs are apt to generate high noises. Taking on this configuration will effectively enhance the signal to noise ratio.

Gain control of cascaded PGAs may be carried out in the following manner. An ADC detects the final signal level experienced by the PGAs. On the basis of the detected result, the control and operation device determines new gains, and feeds back the gains to the PGAs each to thereby switch the gains of each of the PGAs simultaneously or sequentially.

The initial gains of the PGAs are set to voluntary values, however the signal level before a preamble term is usually low, and so, the gains of the PGAs are set to the maximum, for example, +20 dB as the initial setting. Until the control and operation device of the radio receiver determines that the signal level entering the ADC becomes the maximum in the input dynamic range of the ADC, the gain control is repeated in succession.

Repetitive gain controls are required several times to determine the final optimum gain. At each repetitive control, the method has to ensure the waiting time for awaiting the response by the band-pass filters. Unfortunately, it takes considerable time for the outputs of the cascaded amplifiers to reach convergence (or stabilization). In practice, there are many cases where convergence cannot be obtained within a required time period.

SUMMARY OF THE INVENTION

The object of the invention is to provide a gain-control method and device for cascaded amplifiers, whereby high-speed gain switching is achieved without requiring a high-resolution and high-speed analog to digital converter (ADC). It should be appreciated that the present invention can be implemented in numerous ways, including as a process, an apparatus, a system, a device or a method. Several inventive embodiments of the present invention are described below.

In one embodiment, the gain-control method for cascaded amplifiers detects the input levels of the cascaded PGAs, calculates the optimum gains of the PGAs on the basis of a result of the level detection, and executes the gain control that sets the optimum gains to each of the PGAs by feed-forward substantially at the same time.

In another embodiment, the gain-control device for cascaded amplifiers includes a plurality of PGAs, a level detection device that detects the input levels of the PGAs, a gain setting device that calculates the optimum gains of the PGAs on the basis of the result of the level detection device and that sets the gains of all the PGAs substantially at one time. In this case, the level detection device is preferably composed of peak hold circuits that retain the peak values of the input signals of the PGAs, and an A/D converter that executes A/D conversion to the outputs of the peak hold circuits. Further, the peak hold circuits and the A/D converter may be provided respectively to the input parts of the PGAs.

Advantageously, according to the gain-control method and device for cascaded amplifiers of the invention, the gain switching of the PGAs can be performed faster than the conventional examples without using an especially high-resolution ADC. Further, it is possible to utilize the ADC as the level detector, which the system originally contains in the IC incorporating the gain-control device for cascaded amplifiers, and thereby a novel circuit becomes unnecessary, which presents remarkable effects in power consumption and cost reduction.

These and other characteristics of the present invention will become apparent in the description of the embodiments. It should be appreciated that the present invention can be implemented in numerous ways, including as a process, an apparatus, a system, a device or a method, which are configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

FIG. 9 is a circuit diagram illustrating an internal circuit configuration of the PGA relating to the invention, in accordance with one embodiment of the present invention.

FIG. 10 is a block diagram illustrating another embodiment of the gain-control method and device for cascaded PGAs, in accordance with one embodiment of the present invention.

DESCRIPTION OF THE PREFERRED EMBODIMENTS

An invention for a method and device for gain-control of cascaded amplifiers is disclosed. Numerous specific details are set forth in order to provide a thorough understanding of the present invention. It will be understood, however, to one skilled in the art, that the present invention may be practiced without some or all of these specific details.

Figure 1:
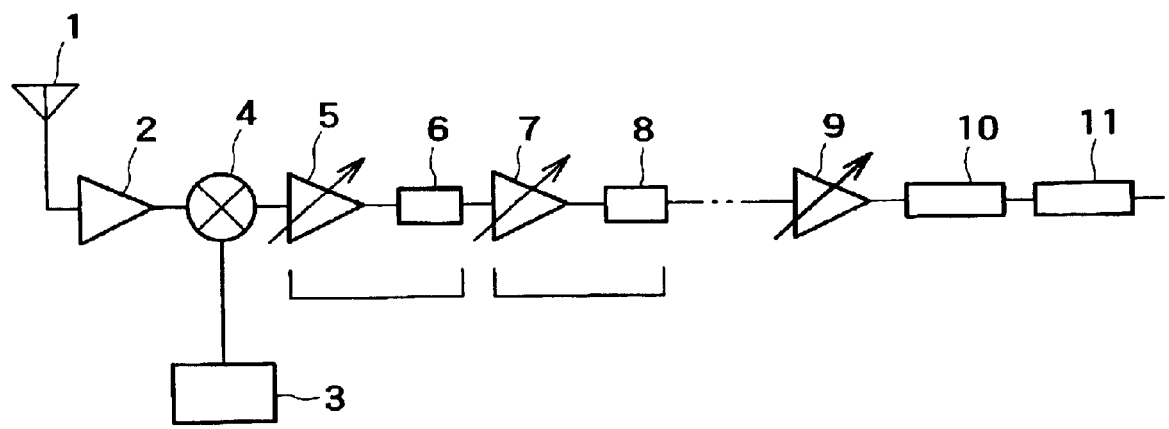
FIG. 1 is a block diagram of a circuit configuration of a general radio receiver, in accordance with one embodiment of the present invention.

FIG. 1 is a block diagram of a circuit configuration of a general radio receiver, in accordance with one embodiment of the present invention. A gigahertz-band high frequency signal inputted from an antenna 1 is amplified by a low-noise amplifier 2, which is mixed with a local signal from a local oscillator 3 by a mixer 4 to be converted into a megahertz-band frequency signal. The signal having been converted into the megahertz-band passes plural programmable gain amplifiers (PGAs) 5, 7, and 9, and band pass filters (BPFs) 6 and 8. The signal is then converted into a digital signal by an analog to digital converter (ADC) 10. The data on the high frequency signal are then decoded by a digital decoder 11.

In a radio receiver, the signal level inputted from the antenna covers a very wide range, which is converted into a suitable level by cascaded PGAs and is finally controlled so as to swing to the maximum within the input dynamic range of the ADC.

The PGAs are located on the pre-stages of the BPFs, as shown in FIG. 1, because the BPFs are apt to generate high noises. Taking on this configuration will effectively enhance the signal to noise ratio.

Figure 2:
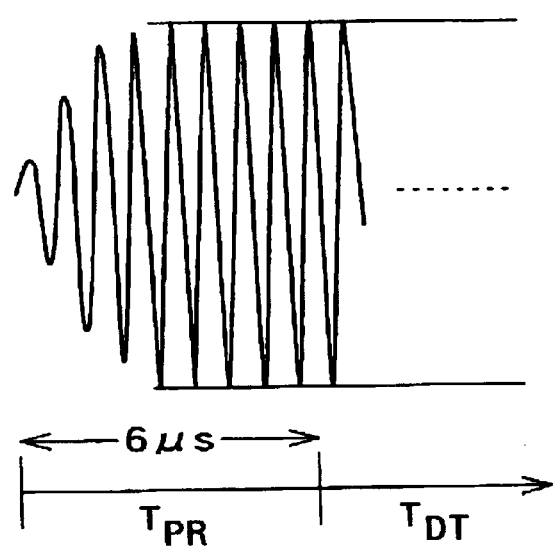
FIG. 2 is a chart illustrating a signal waveform of a short-range radio access system, in accordance with one embodiment of the present invention.

FIG. 2 is a chart illustrating a signal waveform of a short-range radio access system, in accordance with one embodiment of the present invention. As shown in FIG. 2, the preamble term $T_{PR}$ of about 6 µs precedes the data term $T_{DT}$. The PGA is controlled to the optimum gain by utilizing this preamble term, namely, the preparatory term located directly before the reception data signal, and the gain is retained during the data term. The determination of the gain has to be performed after the preamble signal has sufficiently risen. Thus, the preamble term is actually very short and can fully be used for determining the optimum gain of the PGA.

Figure 3:
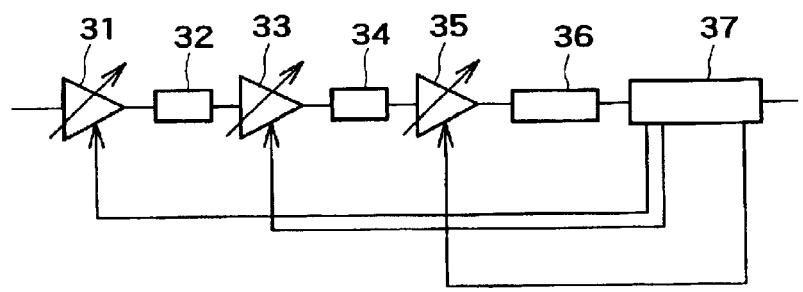
FIG. 3 is a block diagram of a circuit configuration using a programmable gain amplifier (PGA) gain-control method of a feedback, in accordance with one embodiment of the present invention.

FIG. 3 is a block diagram of a circuit configuration using a programmable gain amplifier (PGA) gain-control method of a feedback, in accordance with one embodiment of the present invention. Reference symbols 31, 33, and 35 signify the PGAs that can vary the gain ranging from 0 dB to 20 dB. Reference symbols 32 and 34 are BPFs. Reference symbol 36 is a ADC. Reference symbol 37 is a control and operation device. This example discusses a specific case of the PGAs being connected in three stages. However, a configuration having more stages is possible. Such a conventional example is discussed further detail in the 2002 ISSCC Digest of Technical Paper, vol.45, visual supplement, p.72 (hereinafter referred to as the conventional example 1).

The gain control of the cascaded amplifiers described above is carried out in the following manner. The ADC 36 detects the final signal level experienced by the PGAs 31, 33, and 35. On the basis of the detection result, the control and operation device 37 determines new gains, and feeds back the gains to each of the PGAs, and then simultaneously or sequentially switches the gains of each of the PGAs.

The initial gains of the PGAs 31, 33, and 35 are set to voluntary values, however the signal level before the preamble term is usually low, and so, the gains of the PGAs are set to the maximum, for example, +20 dB as the initial setting. Until the control and operation device 37 determines that the signal level entering the ADC 36 becomes the maximum in the input dynamic range of the ADC 36, the gain control is repeated in succession.

Figure 4:
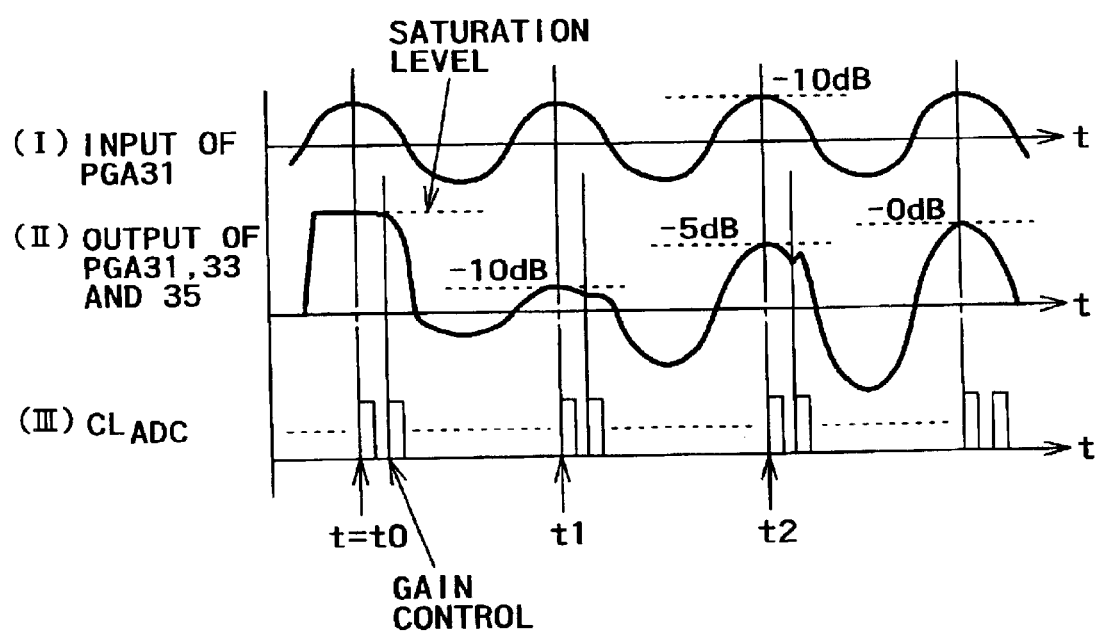
FIG. 4 is a timing chart in the circuit configuration of FIG. 3, in accordance with one embodiment of the present invention.

FIG. 4 is a timing chart in the circuit configuration of FIG. 3, in accordance with one embodiment of the present invention. In the drawing, (I) illustrates the input signal level of the PGA 31 in the first stage, (II) the output signals of the PGAs 31, 33, and 35 each in the first, second, and third stages, and (III) the conversion clock signal $CL_{ADC}$ of the ADC.

In the example of FIG. 4, the input signal level to the first stage PGA 31 is −10 dB (the input dynamic range of the ADC 36 is assumed to be 0 dB). When the input signal level is −10 dB, the outputs of the PGAs 31, 33, and 35 each are in the saturation level at t=t0, and the results of the ACD conversion exceed the target. Accordingly, the control and operation device 37 issues commands to set all the gains of the PGAs 31, 33, and 35 to 0 dB, for example. In this case, the output level of the PGA 35 (namely, the input level of the ADC 36) becomes −10 dB at the next peak (at t=t1), which is too low; and then, the control and operation device 37 issues commands to boost the gain of the PGA 31 to 5 dB. Since the output level of the PGA 35 at the next peak (at t=t2) does not reach the maximum yet in the input dynamic range of the ADC 36, the control and operation device 37 further issues commands to boost the gain of the PGA 31 to 10 dB. This is repeated until the output level of the PGA 35 reaches the maximum level. In the case of FIG. 4, the gain control is conducted three times in total, at the rises of the next clocks at t=t0, t1, t2 until the final gain is determined. Here, FIG. 4 illustrates the gain control of the PGA 31 only in order to simplify the explanation.

The BPFs 32 and 34 inserted between the PGAs have slow response characteristics. Therefore, the control and operation device 37 has to wait for about one cycle at each gain control, until the signal level is stabilized. Normally, the gain controls are necessarily repeated for three times to five times, and when the input signal frequency is 2 MHz, it takes more than 3 to 5 µs to reach the convergence (or stabilization). In the above example, the convergence is obtained only by the gain control of the PGA 31. When the input signal level is further lower such that the convergence is not obtained only by the gain control of the PGA 31, the gain controls of the PGAs 33 and 35 are only needed to reach the convergence.

Figure 5:
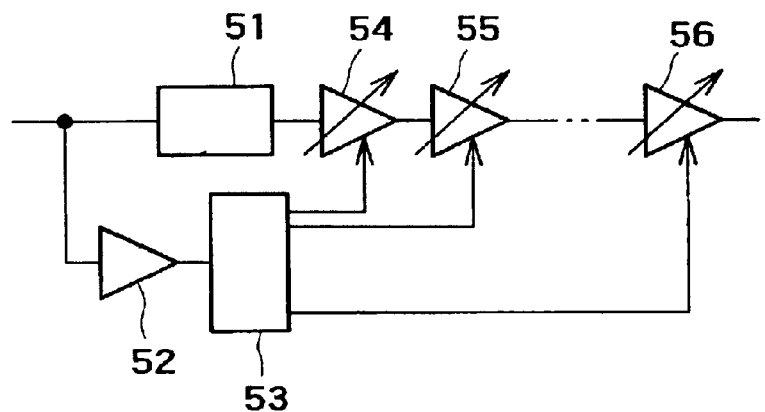
FIG. 5 is a block diagram of a circuit configuration using a PGA gain-control method of a feed-forward, in accordance with one embodiment of the present invention.

FIG. 5 is a block diagram of a circuit configuration using a PGA gain-control method of a feed-forward, in accordance with one embodiment of the present invention. In FIG. 5, the reference symbol 51 signifies a delay circuit, 52 a detector, 53 an ADC, and 54 through 56 PGAs. This control method detects the signal level inputted to the first stage of the cascaded PGAs 54, 55, and 56 by means of the detector 52 and the ADC 53. On the basis of the detected signal level, the method sets the gains of the PGAs each simultaneously through the feed-forward loops. The delay circuit 51 is provided for the real-time processing. To employ this control method will complete the gain control in one cycle.

Such a control method is disclosed in, for example, the JP-A No.191221/1997, which is hereby incorporated by reference.

However, according to the control method of example 1 using the feedback illustrated in FIG. 3, repetitive gain controls are required several times to determine the final optimum gain. At each repetitive control, the method has to ensure the waiting time for awaiting the response by the band-pass filters. Accordingly, it takes considerable time for the convergence, which is a problem solved by the present invention. In practice, there are many cases where the convergence cannot be obtained within the aforementioned preamble term $T_{PR}$ of 6 µs and the gain determination slips out into the data term $T_{DT}$.

According to the control method of example 2 using the feed-forward illustrated in FIG. 5, the problem that the control method of example 1 illustrated in FIG. 3 requires a certain amount of time for the convergence can be avoided. However, all the gains of the PGAs have to be determined by detecting only the input level of the first stage PGA. Accordingly, this method requires a very high-resolution (usually, about 14 bits) and high-speed ADC, which is another problem solved by the present invention.

Figure 6:
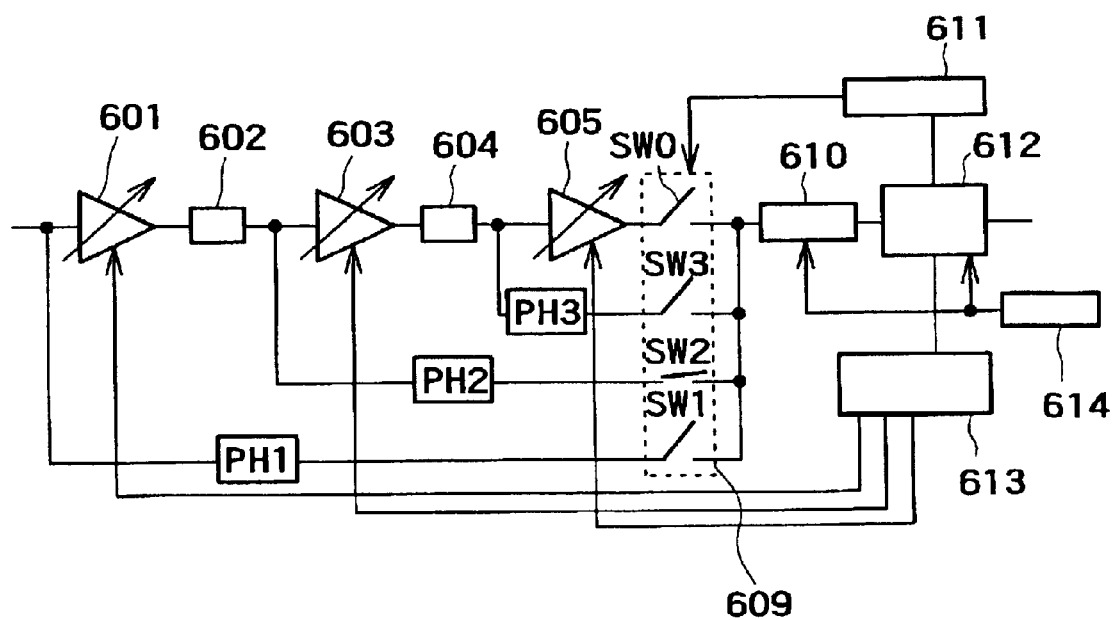
FIG. 6 is a block diagram illustrating a gain-control method and device for cascaded PGAs, in accordance with one embodiment of the present invention.

FIG. 6 illustrates a circuit having three-stage cascaded PGAs, in accordance with one embodiment of the present invention. The three-stage cascaded PGAs have gain-variable range from 0 dB to 20 dB. Note that the embodiment is not limited to three stages, and that a circuit configuration having more or fewer stages is within the scope of the present invention. The circuit of FIG. 6 includes PGAs 601, 603, and 605 that can vary the gain ranging from 0 dB to 20 Db; BPFs 602 and 604; peak hold circuits PH1 through PH3; a switch group 609 that includes switches SW0 through SW3; ADC 610; a switch circuit 611 that controls the switches SW0 through SW3; a control and operation device 612, a gain-control circuit 613, and a clock circuit 614.

The control operation of the cascaded amplifiers described above configured will be discussed in further detail.

The initial gains of the PGAs are set to +20 dB that is generally the maximum value.

In the first place (at t=t0 in FIG. 7, as described later), the ADC 610 detects all the input signal levels of the PGAs 601, 603, and 605 by sequentially switching the switches SW0 through SW3 at a high speed. Here, FIG. 6 illustrates a state in which the switch SW2 is turned ON and the input signal level of the PGA 603 is inputted to the ADC 610 through the peak hold circuit PH2.

Next, the control and operation device 612 calculates the optimum gains each on the basis of the input levels of each of the PGAs 601, 603, and 605, which are detected by the ADC 610. And, at t=t1 in FIG. 7, as described later, the gain-control circuit 613 sets the calculated optimum gains to each of the PGAs, where the gain control is completed. The control and operation device 612 operates by the external clock from the clock circuit 614, calculates the optimum gains based on the input levels of each of the PGAs, and controls the switch control circuit 611 and gain-control circuit 613, etc.

In the sequential high-speed switching operation of the switches SW0 through SW3, the switching operation of the switches SW1 through SW3 serves for the level detection of each of the PGA input signal levels. The switching operation of the switch SW0 serves the post-stage of the IC (not illustrated) to detect the preamble signal, since the switch transmits the output of the PGA 605 to the post-stage of the IC through the ADC 610, while the control and operation device 612 is detecting the input signal levels. After the gain-control circuit 613 has set the gains of each of the PGAs 601, 603, 605, the switch SW0 remains ON. Here, the switches SW1 through SW3 are assumed to be OFF.

Figure 7:
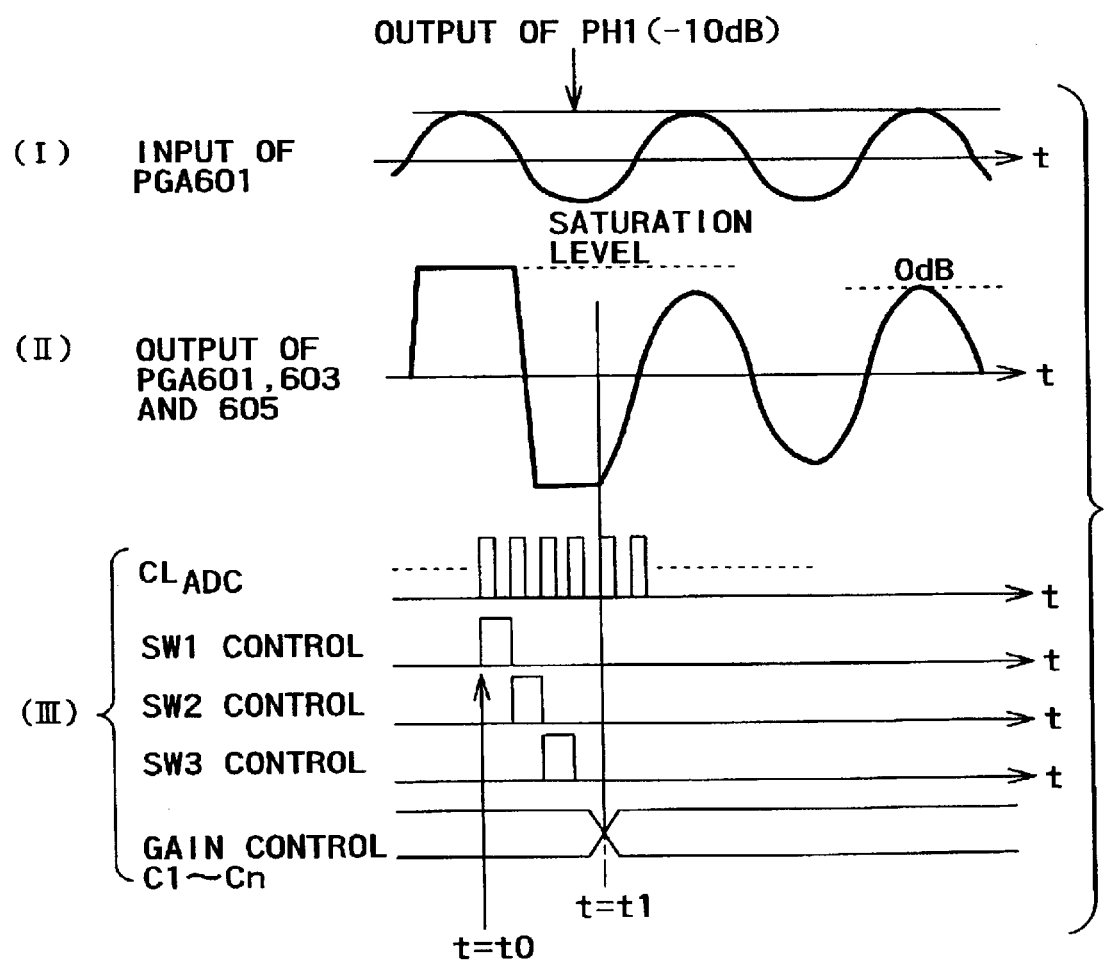
FIG. 7 is a timing chart, where the input signal level of the first stage PGA in the circuit configuration of FIG. 6 is assumed as −10 dB, in accordance with one embodiment of the present invention.

FIG. 7 is a timing chart of the signals in the gain-control circuit of FIG. 6, in accordance with one embodiment of the present invention. FIG. 7 illustrates the switches SW1 through SW3 for the level detection of the PGA input signals, and omits the switch SW0. The control operation will be discussed further in detail with reference to FIG. 7.

In FIG. 7, (I) illustrates the input signal level of the PGA 601, (II) the output signal levels of the PGAs 601, 603, and 605, and (III) the conversion clock signal $CL_{ADC}$ of the ADC, the SW1 through SW3 control signals of the switch control circuit 611 that controls ON/OFF of the switches SW1 through SW3, and the PGA gain-control signals C1 through Cn from the gain-control circuit 613.

First at t=t0, the switch control circuit 611 turns ON the switch SW1 only, and the ADC 610 detects the input level of the PGA 601 that the peak hold circuit PH1 has retained.

In the next conversion clock cycle of the ADC, the switch control circuit 611 turns ON the switch SW2 only, and the ADC 610 detects the input level of the PGA 603 that the peak hold circuit PH2 has retained. Similarly, in the next conversion clock cycle of the ADC, the switch control circuit 611 turns ON the switch SW3 only, and the ADC 610 detects the input level of the PGA 605.

The control and operation device 612 calculates the optimum gains of each of the PGAs 601, 603, and 605 on the basis of the input signal levels of the PGAs which are previously detected, and simultaneously switches all the gains of the PGAs into the optimum values at t=t1, by way of the gain-control circuit 613. The gain switching of the PGAs is then completed. Thus, the gain-control operation converges within one cycle of the input signal in total.

In FIG. 7, the input signal level of the first stage PGA 601 is assumed as −10 dB, for example (here, the input dynamic range of the ADC 610 is assumed as 0 dB). Since the initially set gain of the PGAs 601, 603, and 605 is +20 dB, the output signal levels of the first, second, and third stage PGAs 601, 603, and 605 are saturated as shown in (I) of FIG. 7. Accordingly, the ADC 610 detects the input levels of the first, second, and third stage PGAs as −10 dB, 'saturated', and 'saturated', respectively, and the control and operation device 612 determines that the optimum gains are +10 dB, 0 dB, and 0 dB, respectively.

Figure 8:
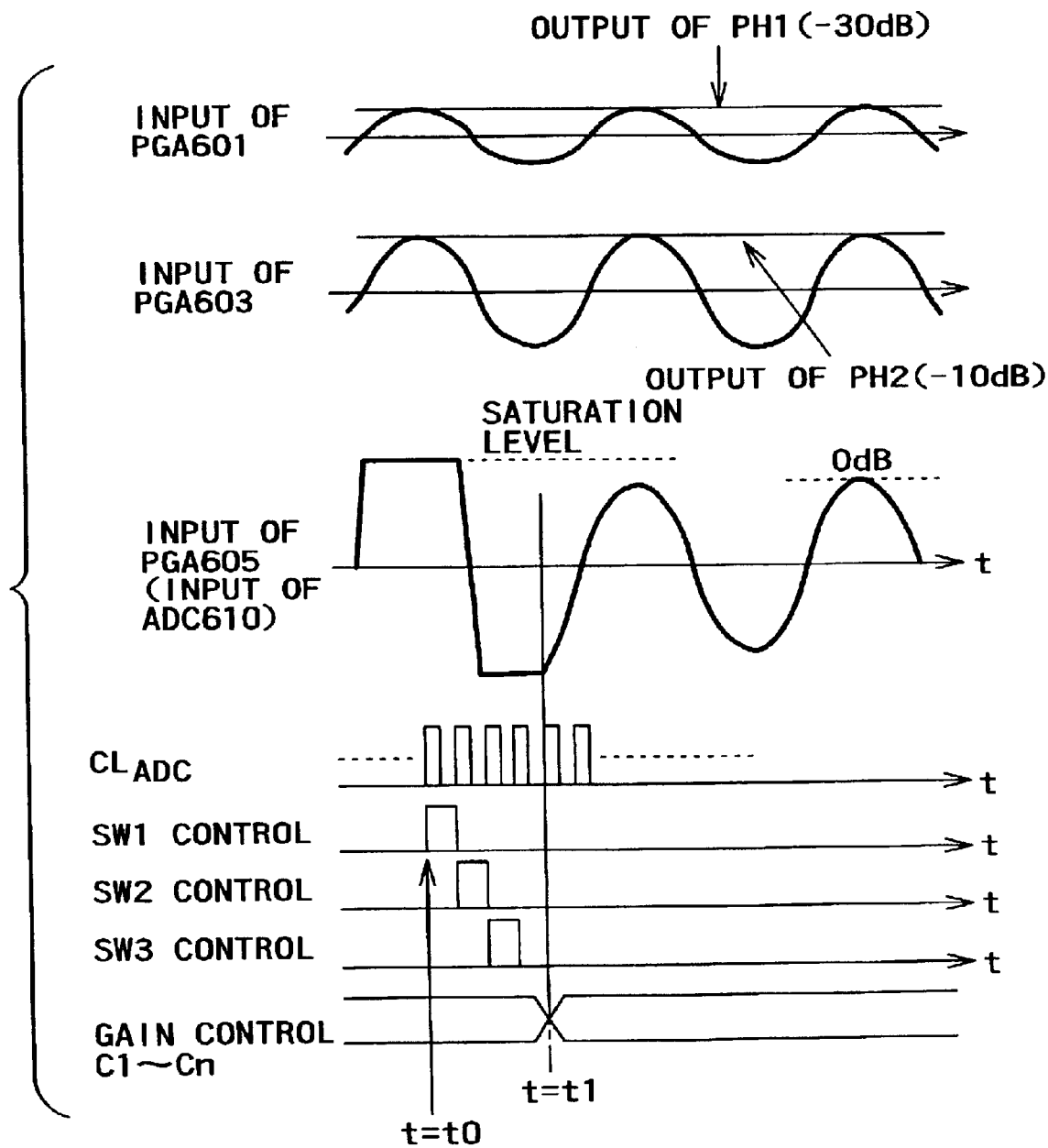
FIG. 8 is a timing chart, where the input signal level of the first stage PGA in the circuit configuration of FIG. 6 is assumed as −30 dB, in accordance with one embodiment of the present invention.

FIG. 8 is a timing chart, in which the input signal level of the first stage PGA 601 is assumed as −30 dB (here, the input dynamic range of the ADC 610 is assumed as 0 dB), in accordance with one embodiment of the present invention. Since the initially set gain of the PGAs is +20 dB, the ADC 610 detects the input levels of the first, second, and third stage PGAs as −30 dB, −10 dB, and 'saturated', respectively, (the input of the ADC is also saturated). Accordingly, the control and operation device 612 determines that the optimum gains are +20 dB, +10 dB, and 0 dB, respectively. Here, the ADC 610 is not necessarily capable of detecting the signal level of −30 dB, and it is only needed to detect the level to be lower than −20 dB. Since the ADC 610 is only needed to have as much resolution as 5 to 6 bits such that it can detect the signal levels covering −20 dB to 0 dB at most, the embodiment does not require such a high-resolution ADC as example 2.

FIG. 9 illustrates an internal circuit of the PGA, in accordance with one embodiment of the present invention. This circuit functions as an inverting amplifier, which is configured by applying a negative feedback to an operational amplifier 91, whose gain is −R2/R1 (R2 signifies a resistor between the inverted input terminal and the output terminal of the operational amplifier). In the drawing, the reference symbol 92 signifies a switch group, and 93 a decoder. The decoder 93 generates signals S1 through Sn on the basis of the PGA control signals C1 through Cn from the gain-control circuit 613, and the signals S1 through Sn control ON/OFF of the switches inside the switch group 92. Thus, the resistor R2 is set to an appropriate value, and the desired gain is attained.

Figure 13:
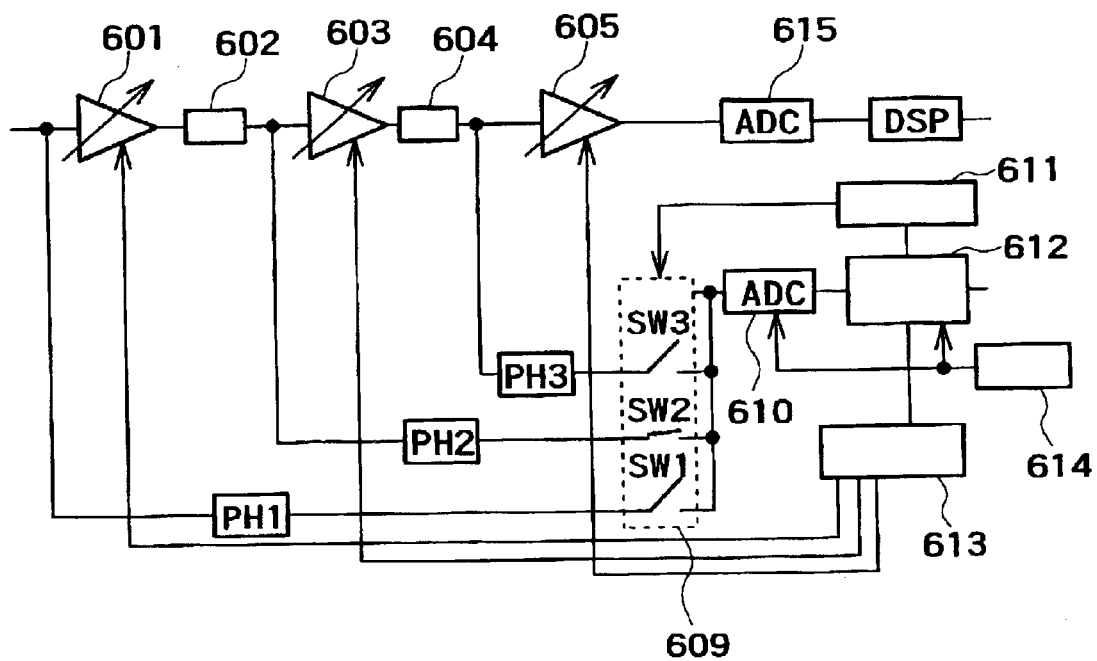
FIG. 13 is a block diagram illustrating a modified example of the first embodiment of the gain-control method and device for cascaded PGAs discussed with reference to FIG. 6, in accordance with one embodiment of the present invention.

In this embodiment, the switch SW0 is provided between the output of the PGA 605 and the input of the ADCv610. However, if there is a necessity of detecting the preamble signal much earlier in a digital signal processor located at the post-stage of the IC, the circuit may be configured with omission of the switch SW0 and addition of an ADC 165, as illustrated in FIG. 13, in order to enable the main signal processing in parallel while the gain control is being executed by sequentially detecting and switching the levels of the PGAs.

FIG. 10 illustrates another circuit having three-stage cascaded PGAs, in accordance with one embodiment of the present invention. Note that the embodiment is not limited to three stages, and that a circuit configuration having more or fewer stages is within the scope of the present invention. FIG. 10 includes PGAs 102, 106, and 110; BPFs 104 and 108; peak hold circuits PH1 through PH3; gain-control circuits 103, 107, and 111; level detectors LV1 through LV3; a clock circuit 115; a timing generator 116, which is discussed further in the description with reference to FIG. 11; and an ADC 117. The PGA has the substantially the same internal circuit configuration as the circuit illustrated in FIG. 9.

The gain-control method of this embodiment is similar to the gain-control method described with reference to FIG. 6. However, in this embodiment, the input signal level of each of the PGAs is detected by means of the peak hold circuits and level detectors that are provided to each stage.

Figure 11:
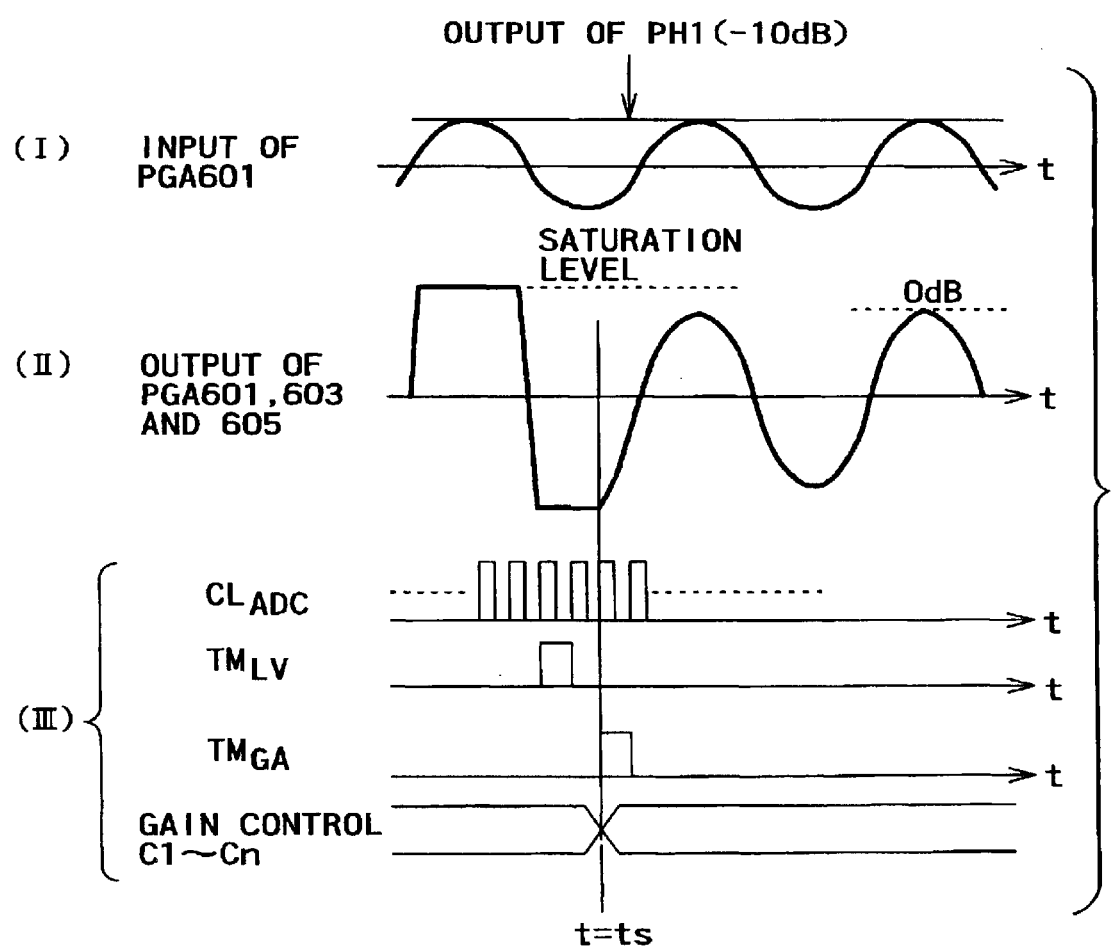
FIG. 11 is a timing chart in the circuit configuration of FIG. 10, in accordance with one embodiment of the present invention.

FIG. 11 is a timing chart of the signals in the gain-control circuit of the configuration illustrated in FIG. 10, in accordance with one embodiment of the present invention. In FIG. 11, (I) illustrates the input signal level of the PGA 102; (II) the output signal levels of the PGAs, and (III) the conversion clock signal $CL_{ADC}$ of the ADC; a timing control signal $TM_{LV}$ for level detection from the timing generator 116, which controls the detection timing of the level detectors; a timing control signal $TM_{GA}$ for gain switching from the timing generator 116, which controls the switching timing of the gain-control circuits; and the PGA gain-control signals C1 through Cn from the gain-control circuits.

Synchronizing with the timing control signal $TM_{LV}$ for level detection supplied from the timing generator 116, the level detectors LV1 through LV3 detect the input signal levels of the PGAs 102, 106, and 110 all at once through the peak hold circuits PH1 through PH3. On the basis of the above detection results, the gain-control circuits 103, 107, and 111 switch all the gains of the PGAs into the appropriate values all at once (at t=ts, in FIG. 11), synchronizing with the timing control signal $TM_{GA}$ for gain switching supplied from the timing generator 116.

In this manner, the level detection and the gain setting of the relevant stages are carried out simultaneously. Therefore, the circuit of this embodiment is able to complete the gain setting faster than the gain-control circuit of the configuration illustrated in FIG. 6.

Figure 12:
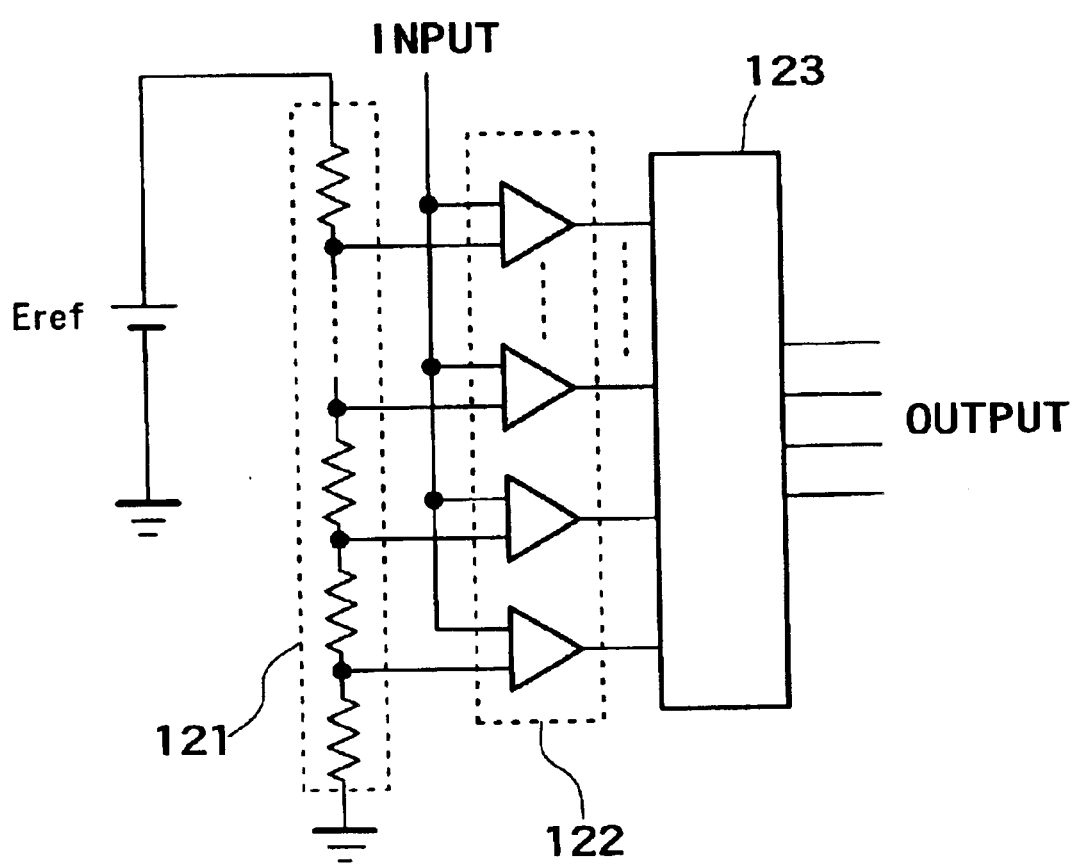
FIG. 12 is a circuit diagram illustrating an internal circuit configuration of the level detector used in FIG. 10, in accordance with one embodiment of the present invention.

FIG. 12 illustrates an example of the internal circuit of a level detector LV1, LV2, or LV3, in accordance with one embodiment of the present invention. FIG. 12 includes a resistor group 121 in which multiple resistors each having appropriate resistances are connected in series; comparator group 122 including multiple comparators, and a decoder 123. This circuit has substantially the same configuration as a parallel-comparison type ADC. In this circuit, the comparator group 122 compares an analog input signal with the finely set voltages obtained by the divide using resistive ratio of a reference voltage Eref to thereby detect the input signal level, and the decoder 123 converts the result into the digital signal.

However, when the ADC is employed for the level detector of this embodiment, it is convenient to apply the logarithmic conversion (decibel conversion) to the input signal level and output the converted level, because the input signal level of the PGA has a very large dynamic range. Therefore, the divide using resistive ratio uses an appropriate ratio based on calculation, instead of division into equal parts as used in a general ADC. In the same manner as the embodiment 1, the circuit configuration of this embodiment does not require an especially high-resolution level detector, and yet it is capable of performing high-speed gain switching, compared with the examples discussed with reference to FIG. 1 through FIG. 5.

System And Method Implementation

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MDs), optical discs, DVD, CD-ROMS, micro-drive, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/specialized computer or microprocessor are software modules for implementing the teachings of the present invention, including, but not limited to, detecting input levels of the programmable gain amplifiers, calculating optimum values of gains of the programmable gain amplifiers on the basis of a result of the level detection, and executing a gain control that sets the optimum values of gains to each of the programmable gain amplifiers by feed-forward substantially at one time, according to processes of the present invention.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A gain-control method for cascaded amplifiers containing programmable gain amplifiers, the gain-control method comprising:
   detecting input levels of the programmable gain amplifiers;
   calculating optimum values of gains of the programmable gain amplifiers on the basis of a result of the level detection; and
   executing a gain control that sets the optimum values of gains to each of the programmable gain amplifiers by feed-forward substantially at one time,
   wherein the gain control is executed by use of a preparatory term located directly before a reception data signal.

2. The gain-control method of claim 1, wherein the step of detecting input levels includes:
   retaining peak values of input signals of the programmable gain amplifiers; and
   applying A/D conversion to the retained peak values.

3. A gain-control method for cascaded amplifiers containing programmable gain amplifiers, the gain-control method comprising:
   detecting input levels of the programmable gain amplifiers;
   calculating optimum values of gains of the programmable gain amplifiers on the basis of a result of the level detection; and
   executing a gain control that sets the optimum values of gains to each of the programmable gain amplifiers by feed-forward substantially at one time,
   wherein the step of detecting input levels includes:
   retaining peak values of input signals of the programmable gain amplifiers; and
   applying sequential A/D conversion to the retained peak values while sequentially switching the peak values.

4. A gain-control device for cascaded amplifiers, the gain-control device comprising:
   programmable gain amplifiers;
   a level detection device that detects input levels of the programmable gain amplifiers; and
   a gain setting device that is configured to calculate optimum values of gains of the programmable gain amplifiers on the basis of the result of the level detection device, and to set the gains of all the programmable gain amplifiers substantially at one time,
   wherein the gain setting device uses a preparatory term located directly before a reception data signal.

5. The gain-control device of claim 4, wherein the level detection device includes peak hold circuits that retain peak values of input signals of the programmable gain amplifiers, and an A/D converter that executes A/D conversion to outputs of the peak hold circuits.

6. A gain-control device for cascaded amplifiers, the gain-control device comprising:
   programmable gain amplifiers;
   a level detection device that detects input levels of the programmable gain amplifiers and that includes peak hold circuits which retain peak values of input signals of the programmable gain amplifiers;
   a gain setting device that is configured to calculate optimum values of gains of the programmable gain amplifiers on the basis of the result of the level detection device, and to set the gains of all the programmable gain amplifiers substantially at one time; and
   switches on each post-stage of the peak hold circuits,
   wherein the level detection device further includes an A/D converter that executes A/D conversion to outputs of the peak hold circuits,
   wherein the switches are sequentially switched so that the outputs of the peak hold circuits are sequentially connected to the A/D converter, and
   wherein sequential A/D conversion is executed to the output levels of the peak hold circuits.

7. The gain-control device of claim 6, wherein the programmable gain amplifiers are configured to use inverting amplifiers containing operational amplifiers and negative feedbacks, and to adjust values of feedback resistors that determine gains by switching the switches, thereby making the gains of the programmable gain amplifiers variable.

8. A gain-control device for cascaded amplifiers, the gain-control device comprising:
   programmable gain amplifiers;
   a level detection device that detects input levels of the programmable gain amplifiers; and
   a gain setting device that is configured to calculate optimum values of gains of the programmable gain amplifiers on the basis of the result of the level detection device, and to set the gains of all the programmable gain amplifiers substantially at one time,
   wherein the programmable gain amplifiers are configured to use inverting amplifiers containing operational amplifiers and negative feedbacks, and to adjust values of feedback resistors that determine gains by switching, thereby making the gains of the programmable gain amplifiers variable.

9. A gain-control device for cascaded amplifiers, the gain-control device comprising:
   programmable gain amplifiers;
   a level detection device that detects input levels of the programmable gain amplifiers; and
   a gain setting device that is configured to calculate optimum values of gains of the programmable gain amplifiers on the basis of the result of the level detection device, and to set the gains of all the programmable gain amplifiers substantially at one time,
   wherein the level detection device includes peak hold circuits that retain peak values of input signals of the programmable gain amplifiers, and an A/D converter that executes A/D conversion to outputs of the peak hold circuits, and
   wherein the peak hold circuits and the A/D converter are provided respectively to output parts of the programmable gain amplifiers.

10. A computer-readable medium carrying one or more sequences of one or more instructions for controlling a distributed storage system for controlling gain of cascaded amplifiers containing programmable gain amplifiers, the one or more sequences of one or more instructions including instructions which, when executed by one or more processors, cause the one or more processors to perform the steps of:

detecting input levels of the programmable gain amplifiers;

calculating optimum values of gains of the programmable gain amplifiers on the basis of a result of the level detection; and executing a gain control that sets the optimum values of gains to each of the programmable gain amplifiers by feed-forward substantially at one time, wherein the gain control is executed by use of a preparatory term located directly before a reception data signal.

11. The computer-readable medium of claim 10, wherein the step of detecting input levels further causes the processor to perform the steps of:

retaining peak values of input signals of the programmable gain amplifiers; and applying A/D conversion to the retained peak values.

12. A computer-readable medium carrying one or more sequences of one or more instructions for controlling a distributed storage system for controlling gain of cascaded amplifiers containing programmable gain amplifiers, the one or more sequences of one or more instructions including instructions which, when executed by one or more processors, cause the one or more processors to perform the steps of:

detecting input levels of the programmable gain amplifiers;

calculating optimum values of gains of the programmable gain amplifiers on the basis of a result of the level detection; and executing a gain control that sets the optimum values of gains to each of the programmable gain amplifiers by feed-forward substantially at one time, wherein the step of detecting input levels further causes the processor to perform the steps of:

retaining peak values of input signals of the programmable gain amplifiers; and applying sequential A/D conversion to the retained peak values while sequentially switching the peak values.

* * * * *